United States Patent [19]

Shimizu et al.

[11] Patent Number: 4,603,419
[45] Date of Patent: Jul. 29, 1986

[54] SEMICONDUCTOR LASER STRUCTURE INCLUDING DUAL MOUNTS HAVING RIDGE AND GROOVE ENGAGEMENT

[75] Inventors: Hirokazu Shimizu, Toyonaka; Kunio Itoh, Uji; Takashi Sugino; Masaru Wada, both of Takatsuki, all of Japan

[73] Assignee: Matsushita Electric Industrial Co., Ltd., Kadoma, Japan

[21] Appl. No.: 768,144

[22] Filed: Aug. 22, 1985

Related U.S. Application Data

[60] Division of Ser. No. 614,390, May 25, 1984, Pat. No. 4,546,478, which is a continuation of Ser. No. 270,350, Jun. 4, 1981, abandoned.

[30] Foreign Application Priority Data

Jun. 17, 1980 [JP]  Japan ................................ 55-82640

[51] Int. Cl.$^4$ ............................................. H01S 3/045
[52] U.S. Cl. .......................................... 372/36; 357/81
[58] Field of Search ...................... 372/36, 44; 357/17, 357/81

[56] References Cited

U.S. PATENT DOCUMENTS

| | | | |
|---|---|---|---|
| 4,347,655 | 9/1982 | Zory et al. | 357/81 |
| 4,411,057 | 10/1983 | Duda et al. | 372/36 |

FOREIGN PATENT DOCUMENTS

| | | | |
|---|---|---|---|
| 0003391 | 1/1977 | Japan | 372/36 |
| 0014181 | 2/1979 | Japan | 372/36 |

*Primary Examiner*—James W. Davie
*Attorney, Agent, or Firm*—Cushman, Darby & Cushman

[57] ABSTRACT

A mounting of semiconductor laser chip on a heat sink or metal mount is improved so as to enable high accuracy of position and direction. A heat sink or metal mount, on which a semiconductor laser chip is mounted, comprises two parts, namely a main mount or larger portion and a sub-mount or smaller portion. The semiconductor laser chip is soldered by a solder layer on the sub-mount utilizing a microscope so as to assure an accurate position and an accurate direction with respect to the sub-mount. Then, the sub-mount is soldered on the main mount by a solder layer with an accurate relation both in position and direction by engaging a linear ridge as a first engaging means provided on the upper face of the main mount with a straight groove and a rear end face as a second engaging means. As a result of the above-mentioned structure, accurate position and direction of the semiconductor laser chip with respect to the mount is easily obtainable with a high yield.

1 Claim, 3 Drawing Figures

4,603,419

SEMICONDUCTOR LASER STRUCTURE INCLUDING DUAL MOUNTS HAVING RIDGE AND GROOVE ENGAGEMENT

This is a division, of application Ser. No. 614,390, filed 5-25-84, which issued as U.S. Pat. No. 4,546,478 and which was a continuation of copending abandoned application Ser. No. 270,350, filed June 4, 1981 abandoned.

BACKGROUND OF THE INVENTION

1. Field of the Invention

The present invention relates to an improvement in a semiconductor laser.

More particularly, the present invention concerns an improved structure of the semiconductor laser mount for obtaining accurate position and direction of the laser with respect to the mount.

2. Prior Art

As is well known, semiconductor lasers require a good heat radiation and dissipation, since a current of a high density flows in it when oscillating. Accordingly, in order to assure the good heat dissipation, the semiconductor laser chip is usually mounted on a copper heat sink or mount. As shown in FIG. 1, it has been known that a sub-mount 2 of copper or silicon is inserted between the semiconductor laser chip 4 and a main mount 1 of copper. Solder layers 3 and 31 are used for bonding the semiconductor laser chip 4 on the sub-mount 2 and the sub-mount 2 on the main mount 1, respectively.

In the semiconductor laser device, such sub-mount 2 is usually shaped in a rectangular parallelopiped, since such shape is suitable for making with an accurate size and shape. The accuracy of the shape of the sub-mount is advantageous in good bonding necesary for good heat dissipation and in accurate positioning necessary for avoiding undesirable masking of oscillated light. The bonding of the laser chip on the sub-mount is advantageous in that the testing of the semiconductor laser chip 4 can be made for the chip bonded on the sub-mount 2.

The sub-mount 2 with the semiconductor laser chip 4 thereon is then bonded on the copper heat sink or main mount 1, and the bonding requires a high accuracy in position and direction. Since no particular means is devised for attaining a high accuracy of the position and direction in the conventional structure of FIG. 1, it has been very difficult to attain a high accuracy of position and direction in bonding between the sub-mount and the main mount.

In summary, the conventional configuration of FIG. 1 has not fulfilled the requirements of bonding of the sub-mount 2 with semiconductor laser chip 4 thereon with very highly accurate positional and directional relation with ease and high manufacturing yield.

SUMMARY OF THE INVENTION

The present invention adopted novel structure of the heat sink or mount of the semiconductor laser, and can improve accuracy of bonding of the sub-mount on the main mount in positional and directional relation of the bonding, and thereby can improve manufacturing yield of the semiconductor lasers.

DESCRIPTION OF PREFERRED EMBODIMENTS

Figure 1:
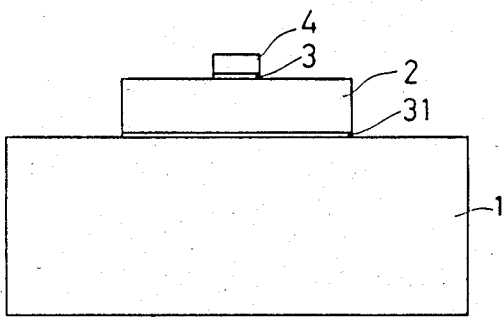
FIG. 1 is an elevation view of the conventional semiconductor laser.
Figure 2A:
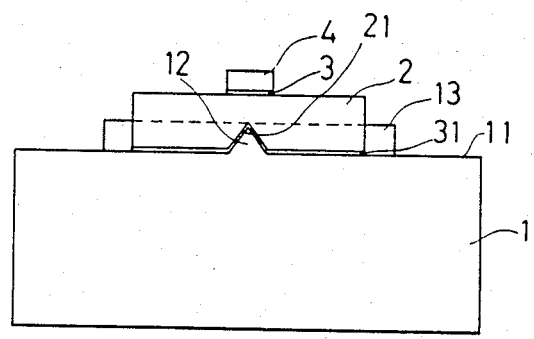
FIG. 2(a) is an elevation view of an example of semiconductor laser embodying the present invention.
Figure 2B:
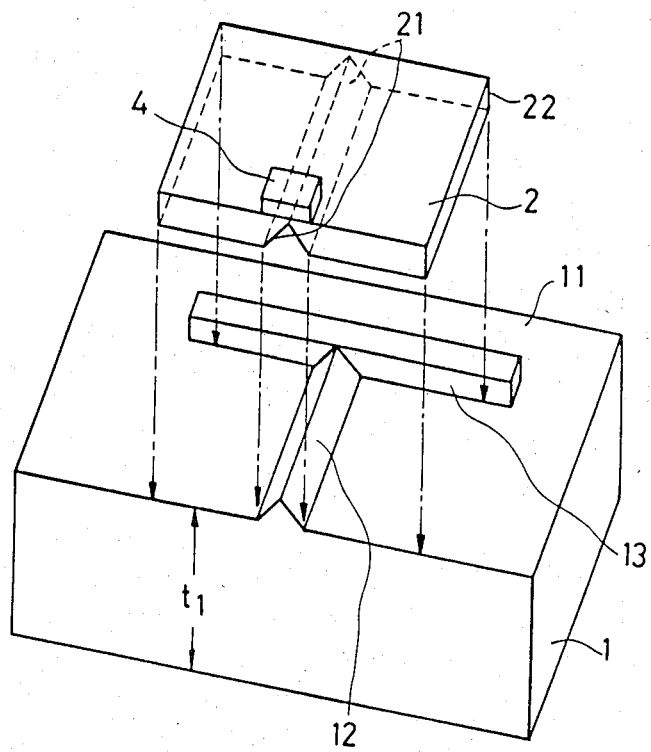
FIG. 2(b) is a perspective view of the example of FIG. 2(a).

The present invention is elucidated in detail with reference to FIGS. 2(a) and 2(b), which show preferred embodiments in accordance with the present invention.

The embodiments of the present invention comprises a first engaging means on the upper face of the main mount and a second engaging means on the bottom of submount, so that the sub-mount is easily guided to a desired accurate position with an accurate direction. The engaging means comprise at least an abutting wall and a slideguide. By utilizing the engaging means, the sub-mount can be mounted accurately on a designed position and direction without need of particular skill. Furthermore, by means of the engaging means, the sub-mount can be easily slide-guided on the right position of the main mount, so that an accurate mounting work can be made easily. And still furthermore, by means of the abovementioned structure, the bonding area between the main mount and the sub-mount increases, thereby increasing stability of bonding and thermal conductivity at the bonding.

The invention is hereinafter elucidated with reference to the accompanying drawings, wherein FIG. 2(a) and FIG. 2(b) show a first example, and FIG. 2(a) is a front elevation view, wherein direction of output laser light is perpendicular to the surface of the paper. A main part 1 of the heat sink or mount is made of a material of good thermal conductivity, for instance, copper. A linear protrusion or ridge protrusion 12 extending to the front end of the main mount 1 and a flat abutting wall 13 which is disposed perpendicular to the ridge protrusion 12 are provided on a principal face or upper surface 11 of the main mount 1. The ridge protrusion 12 and the abutting wall 13 constitute a first engaging means. A semiconductor laser chip 4, for instance, a GaAs-GaAsAl laser chip is bonded on the upper face of a sub-mount 2 made of a material of good thermal conductivity, for instance, silicon. And the sub-mount 2 has a linear groove 21 of an inverted V shaped section on its bottom face to be bonded on the principal face 11 of the main mount 1. A rear end face 22 of the sub-mount 2 forms a flat abutting face to be bonded on the abutting wall 13. The linear groove 21 and the abutting face 22 form a second engaging means. In assembling, the semiconductor laser chip 4 is bonded by means of a solder 3 of, for instance an In-solder on the upper face of the sub-mount 2 by utilizing a known microscope for assembling; and thereafter the submount 2 is bonded on the upper face of the main-mount 1 by means of another solder 31 of, for instance an Insolder of a lower melting temperature than that of the solder 3. When mounting the sub-mount 2 on the main mount 1, a suitable jig (not shown) having the same thickness as the thickness $t_1$ of the main mount is used, in a manner that the sub-mount 2 is slid from the upper face of the jig to the upper face 11 of the main mount 1, engaging the groove 21 on the ridge protrusion 12 and sliding the sub-mount 2 along the ridge protrusion as a sliding guide, and the sub-mount 2 is slid until the rear end face 22 of the sub-mount abuts the abutting wall 13 of the main mount 1. The solder layer 31 has been preliminarily formed on the upper surface 11 of the main mount 1. After the sub-mount 2 is disposed to the right position on the main mount 1, the assemblage is heated to solder them each other by melting the solder layer 31. The ridge protrusion 12 serves as a sliding guide.

What is claimed is:

1. A semiconductor laser comprising:
   a semiconductor laser chip;
   a sub-mount on which said semiconductor laser chip is bonded by means of a solder layer,
   a main mount on which said sub-mount is bonded by means of another solder layer,
   characterized in that
   said sub-mount is bonded on said main mount in a manner that a first engaging means, formed on said main mount and a second engaging means formed on the bottom part of said sub-mount engage each other, wherein
   said first engaging means comprises a linear ridge and an abutting wall, and
   said second engaging means comprises a groove shaped to engage with said linear ridge and an abutting rear end face.

* * * * *